US011424268B2

(12) United States Patent
Chia et al.

(10) Patent No.: US 11,424,268 B2
(45) Date of Patent: Aug. 23, 2022

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Han-Jong Chia, Hsinchu (TW); Yu-Ming Lin, Hsinchu (TW); Zhiqiang Wu, Hsinchu County (TW); Sai-Hooi Yeong, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/737,600

(22) Filed: Jan. 8, 2020

(65) Prior Publication Data
US 2021/0210496 A1 Jul. 8, 2021

(51) Int. Cl.
*H01L 27/11* (2006.01)
*H01L 27/1159* (2017.01)
*H01L 29/423* (2006.01)
*H01L 27/11507* (2017.01)
*H01L 29/66* (2006.01)
(Continued)

(52) U.S. Cl.
CPC .... *H01L 27/1159* (2013.01); *H01L 27/11507* (2013.01); *H01L 28/90* (2013.01); *H01L 29/40111* (2019.08); *H01L 29/42364* (2013.01); *H01L 29/6684* (2013.01); *H01L 29/78391* (2014.09)

(58) Field of Classification Search
CPC ........... H01L 27/1159; H01L 29/42364; H01L 28/90; H01L 27/11507; H01L 29/40111; H01L 29/6684; H01L 29/78391
See application file for complete search history.

(56) References Cited

U.S. PATENT DOCUMENTS 5,969,380 A * 10/1999 Seyyedy ........... H01L 27/11502
257/295
2003/0047771 A1 * 3/2003 Kweon .................. H01L 28/60
257/306

(Continued)

OTHER PUBLICATIONS

Si Joon Kim et al., Effect of film thickness on the ferroelectric and dielectric properties of low-temperature (400° C) Hf0.5Zr0.5O2 films, Apr. 2018, Applied Physics Letters 112, pp. 172902-1 to 172902-4. (Year: 2018).*

*Primary Examiner* — Charles D Garber
*Assistant Examiner* — S M Sohel Imtiaz
(74) *Attorney, Agent, or Firm* — WPAT, P.C. Intellectual Property Attorneys; Anthony King

(57) ABSTRACT

A semiconductor structure and manufacturing method thereof are provided. The semiconductor structure includes a substrate having a first surface, a plurality of ferroelectric layers stacking over the first surface, and a plurality of metal layers stacking over the first surface of the substrate, wherein each of the metal layers is on each of the ferroelectric layers. The operations of the method for manufacturing the semiconductor structure includes providing a substrate having a first surface, and forming a plurality of stack units over the first surface of the substrate The forming of each of the stack units includes the operations of forming a ferroelectric layer and forming a metal layer on the ferroelectric layer.

20 Claims, 16 Drawing Sheets

(51) Int. Cl.
*H01L 21/28* (2006.01)
*H01L 29/78* (2006.01)
*H01L 49/02* (2006.01)

(56) References Cited

U.S. PATENT DOCUMENTS

| | | | |
|---|---|---|---|
| 2004/0061153 A1* | 4/2004 | Misewich | H01L 27/11585 257/295 |
| 2008/0124935 A1* | 5/2008 | Chang | H01L 21/3065 438/700 |
| 2016/0064391 A1* | 3/2016 | Li | H01L 27/11507 365/145 |
| 2016/0064510 A1* | 3/2016 | Mueller | H01L 29/516 257/295 |
| 2017/0162250 A1* | 6/2017 | Slesazeck | H01L 29/517 |
| 2017/0162587 A1* | 6/2017 | Chavan | H01L 29/517 |
| 2019/0229193 A1* | 7/2019 | Toh | H01L 29/408 |
| 2020/0006352 A1* | 1/2020 | Avci | H01L 21/76831 |
| 2020/0105940 A1* | 4/2020 | Maj | H01L 29/66757 |

\* cited by examiner

SEMICONDUCTOR STRUCTURE AND MANUFACTURING METHOD THEREOF

FIELD

The present disclosure is related to a semiconductor structure, more particularly, to a semiconductor structure includes a plurality of thin ferroelectric layers stack with a plurality of thin metal layers alternately.

BACKGROUND

Typically, a random access memory (RAM) includes memory cells that each store a bit "0" or "1" of data when a write operation is performed thereon that can be retrieved later by performing a read operation. A RAM can be volatile or non-volatile. The volatile RAM requires power to retain data stored therein. As opposed to the volatile RAM, the non-volatile RAM ensures data retention even after the power is removed. The memory cells of the volatile RAM, such as a dynamic RAM (DRAM), each include a capacitor that is either in a charged state or a discharged state. These two states represent the two bits of data.

Ferroelectric RAM (FeRAM) is a RAM similar in construction to DRAM but using a storage layer that exhibits ferroelectricity versus DRAM to achieve non-volatility. Generally, the FeRAM may provide a better speed, low power, and data reliability than conventional RAMs.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
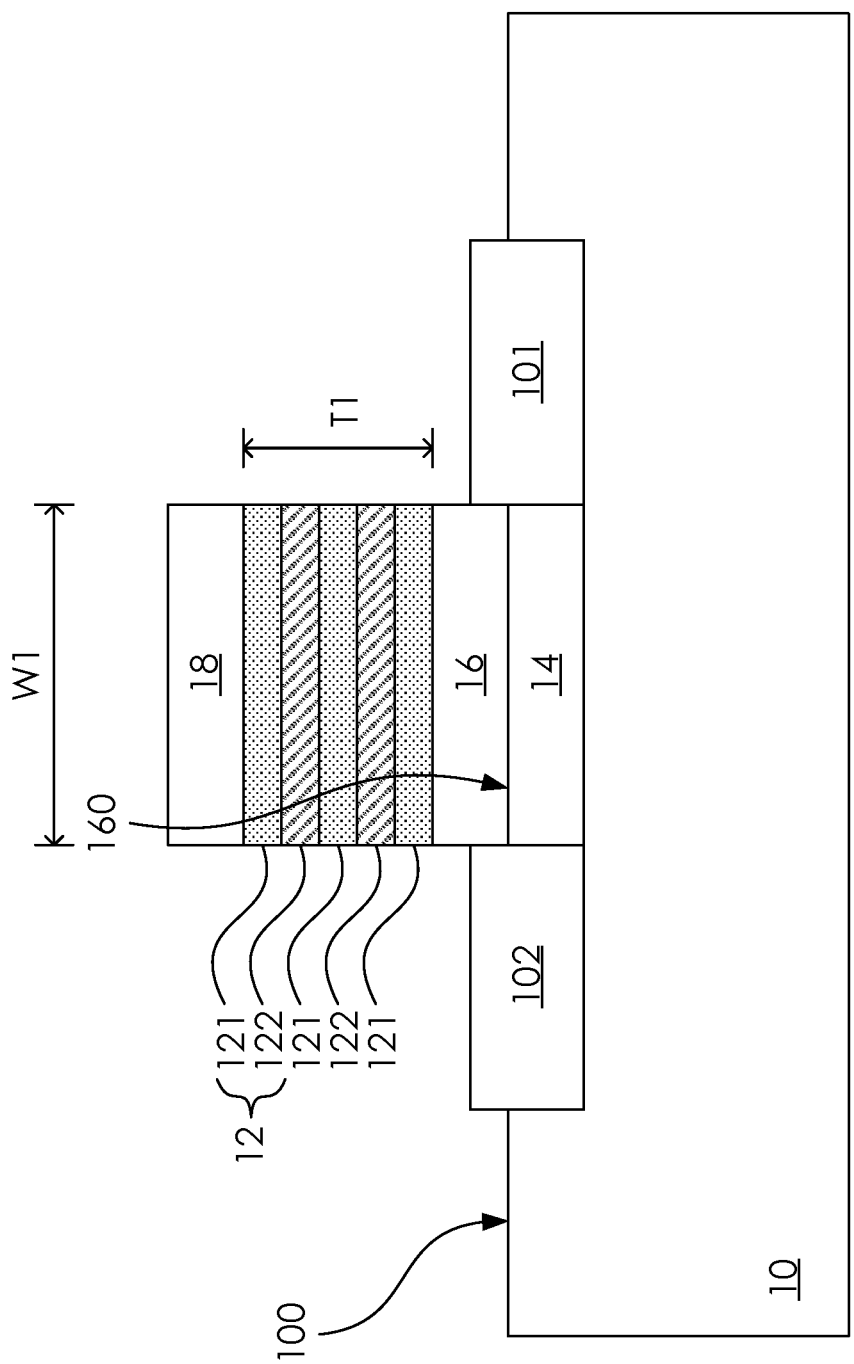
FIG. 1 illustrates a cross-sectional view of a semiconductor structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

Ferroelectricity is a characteristic of certain materials that have a spontaneous electric polarization which can be reversed by the application of an external electric field. The feature of spontaneous polarization of ferroelectric materials implies a hysteresis effect which can be used as a memory function, and ferroelectric capacitors are indeed used to make ferroelectric RAM (FeRAM).

In the miniaturization progress of semiconductor devices, the lateral size of the ferroelectric layer in the FeRAM device is being scaled down. In the meantime, the number of grains in the ferroelectric layer of the FeRAM device are decreased. Such decrease may result in a large variation between memory units in a memory array. For instance, the ferroelectric layer in a memory unit may be composed of only one or two large grains, whereas the ferroelectric layer in another memory unit with same size may be composed of five or six tiny grains. The variation of the amount of the grains may affect multiple parameters critical to the operation of the memory element such as memory window, endurance, retention, remnant polarization, etc.

Accordingly, the present disclosure provides a semiconductor structure having a plurality of ferroelectric layers stacking with a plurality of metal layers alternately. The alternate deposition of the ferroelectric layers and the metal layers may induce the grain size of the ferroelectric materials to be restricted by the thickness of the metal layers. In other words, the longitudinal boundary of each of the grains along the thickness axis of the ferroelectric layer are replaced by the boundaries of the ferroelectric layers and the metal layers, therefore the grains are permitted to grow only to a size as thick as the ferroelectric layer itself.

As shown in FIG. 1, in some embodiments, the semiconductor structure of the present disclosure includes a substrate 10, a plurality of ferroelectric layers 121, and plurality of metal layers 122.

The substrate 10 is a silicon substrate with a first surface 100. The substrate 10 may be some other semiconductor material such as germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. Additionally, the substrate 10 may include a silicon-on-insulator (SOI) substrate. Generally, a SOI substrate includes a layer of semiconductor material such as epitaxial silicon, germanium, silicon germanium, SOI, silicon germanium on insulator (SGOI), or combinations thereof. The substrate 10 may be doped with a p-type dopant such as boron, boron fluorine, aluminum, gallium, or the like. The substrate may alternatively be doped with an n-type dopant such as phosphorus, arsenic, antimony, or the like.

In some embodiments, the substrate includes a first doped region 101 of a first conductivity type and a second doped region 102 of a second conductivity type formed substantially at the first surface 100. The second conductivity type is opposite to the first conductivity type. In some embodiments, the first doped region 101 is a drain region whereas the second doped region 102 is a source region.

A conducting channel 14 may be formed between the first doped region 101 and the second doped region 102. In some embodiments, for instance, in a metal oxide semiconductor field effect transistor, an insulating layer 16 made by silicon oxide may be formed between and above the conducting channel 14. In some embodiments, the insulating layer 16 is adjacent to the first surface 100 of the substrate 10.

The semiconductor structure in the present disclosure may include a Metal Ferroelectric Insulator Semiconductor (MFIS) structure. In such embodiments, a plurality of stack units may be formed on the insulating layer 16, each of the stack units may include a ferroelectric layer and a metal layer. As shown in FIG. 1, a plurality of ferroelectric layers 121 are formed over the first surface 100 of the substrate 10. Also, a plurality of metal layers 122 are formed over the first surface 100 of the substrate 10, and each of the metal layers 122 is formed on each of the ferroelectric layers 121. Accordingly, the plurality of ferroelectric layers 121 and the plurality of metal layers 122 are stacked repeatedly over the insulating layer 16, and the insulating layer 16 is in contact with one of the plurality of ferroelectric layers 121. In some embodiments, the number of the stack units 12 over the insulating layer 16 is greater than or equal to two.

In the MFIS structure, the top metal layer in the stack units 12 may be a metal gate structure 18. Therefore, the ferroelectric layers 121 and the metal layers 122 are stacked between the insulating layer 16 and the metal gate structure 18. The ferroelectric layers 121 are made by ferroelectric materials, such as hafnium (Hf) oxide with dopants of vary percentages including zirconium (Zr), gadolinium (Gd), aluminum (Al), silicon (Si), yttrium (Y), strontium (Sr), lanthanum (La), etc. The ferroelectric materials are normally in single crystalline or polycrystalline forms and possess a reversible spontaneous polarization over a certain temperature range.

In some embodiments, the metal layers 122 are made by conductive materials such as titanium nitride (TiN), tantalum nitride (TaN), tungsten (W), ruthenium (Ru), etc. In some embodiments, the materials of the metal layers 122 are different. In other words, although each of the stack units 12 may include one ferroelectric layer 121 and one metal layer 122, but the combinations of the ferroelectric materials and the conductive materials may be different among different stack units 12.

In some embodiments, the total thickness T1 between the insulating layer 16 and the metal gate structure 18 is about 10 nm. Such thickness is restricted by the size of the MFIS structure in the vertical direction. As aforementioned, at least two sets of the stacked ferroelectric layer 121 and the metal layer 122 are disposed between the insulating layer 16 and the metal gate structure 18, therefore in some embodiments, the thickness of each of the ferroelectric layers 121 is less than 5 nm and the thickness of each of the metal layers 122 is also less than 5 nm.

The thickness of the ferroelectric layers 121 in the present disclosure may be used to restrict the grain size of the ferroelectric material formed between the metal layers 122. As aforementioned, the thickness of each of the ferroelectric layers 121 is less than 5 nm, thereby in the process of forming such thin ferroelectric layers 121, the grain growth may be restricted because there is a longitudinal boundary condition along the vertical direction, which is also the thickness axis of the ferroelectric layers 121. In other words, the grains of the ferroelectric materials are permitted to grow to a size as thick as the ferroelectric layers 121 itself.

Figure 2:
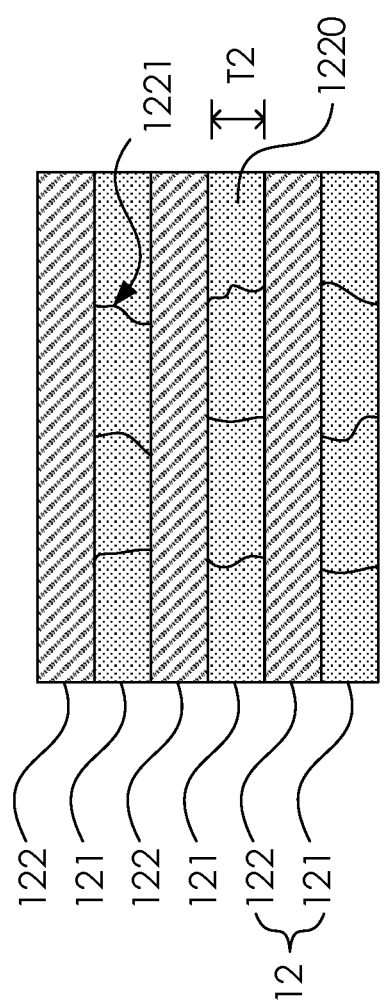
FIG. 2 illustrates a cross-sectional view of a portion of a semiconductor structure according to some embodiments of the present disclosure.

Referring to FIG. 2, in some embodiments, the ferroelectric layers 121 in the stack units 12 may include a plurality of grains 1220. A plurality of the grain boundaries 1221 in the ferroelectric layers 121 may intersect with the surfaces of the metal layers 122, therefore, a thickness T2 of each of the ferroelectric layers 121 is identical to a vertical dimension of the grain 1220 in each of the ferroelectric layers 121. In such structures, the metal layers 122 may be utilized as spacers that interrupts or restricts the growth of the grains 1220. By artificially restricting the size of the grains 1220 in the ferroelectric layers 121, the numbers and the size of the grains 1220 in each of the ferroelectric layers 121 may be substantially consistent. Moreover, the numbers and the size of the grains 1220 in each of the MFIS structure may be substantially consistent. Therefore, the electrical performance and reliability among a plurality of semiconductor devices each having a MFIS structure may also be consistent. Comparing to the ferroelectric layers in conventional semiconductor structures where ferroelectric layer is not sandwiched by the metal layers, the size of the grain is less restricted and so that the ferroelectric layers are occupied by, for instance, only one or two grains. For instance, a vertical dimension of one grain in the ferroelectric layer can be substantially identical to the thickness of the entire ferroelectric layer, for example, approximately 10 nm. In such circumstances, the deviation of the numbers and the size of the grains in different semiconductor devices each having a ferroelectric layer are huge, which may induce the electrical performance and reliability inconsistent among semiconductor devices.

In contrast, the size of the MFIS structure in the horizontal direction is less restricted in the present disclosure. In some embodiment, the width W1 of the stacked ferroelectric layer 121 and the metal layer 122 may in a range of from about 20 nm to about 50 nm. In some embodiments, the width W1 may be less than about 20 nm when the width of the metal gate structure 18 (or be called as the channel length) is reduced to enhance the performance of the semiconductor device.

Figure 3:
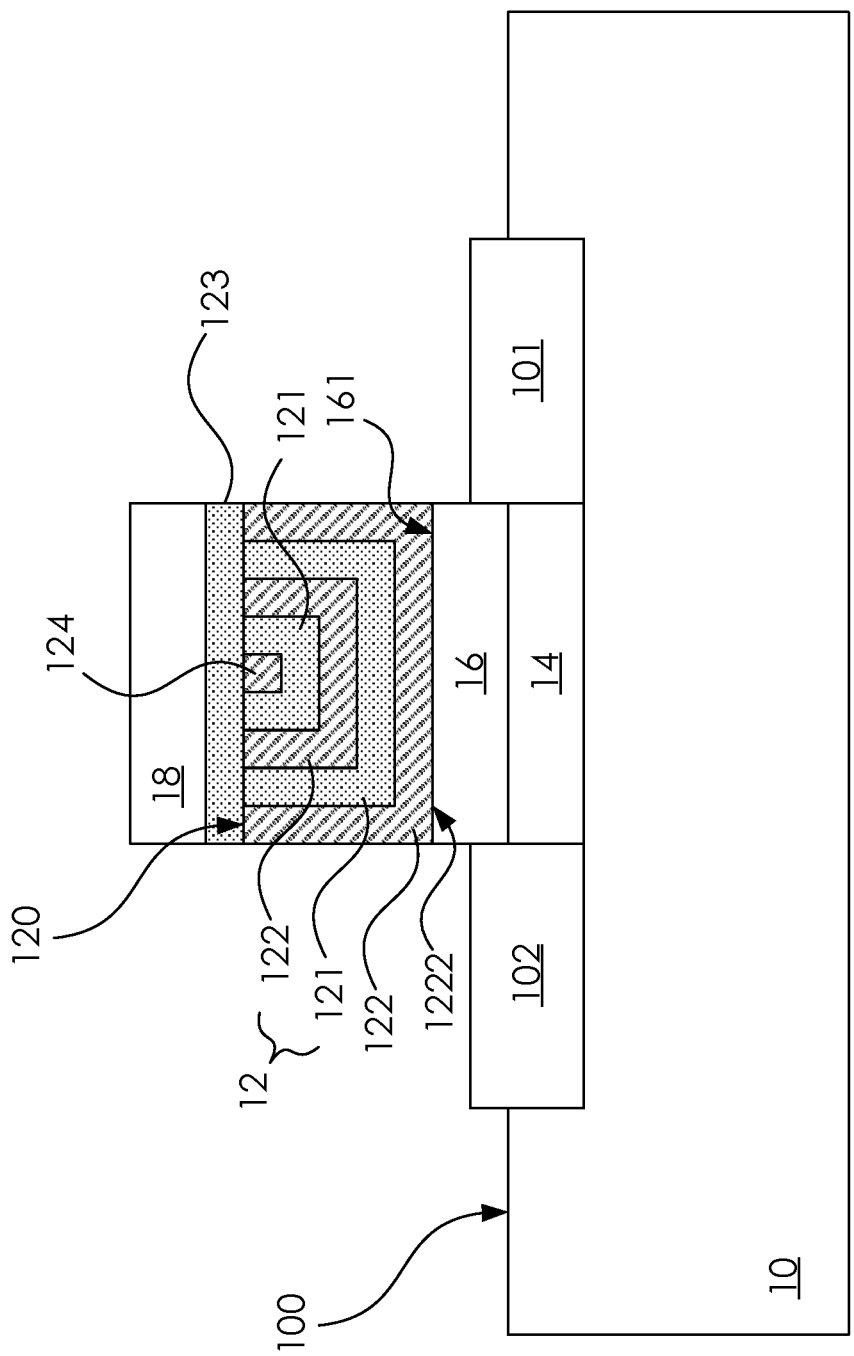
FIG. 3 illustrates a cross-sectional view of a semiconductor structure according to some embodiments of the present disclosure.

In some embodiment, via fill process may be implemented and thereby the MFIS structure may be a U-shape type instead of the planer type as shown in FIG. 1. Referring to FIG. 3, a plurality of stack units 12 including the ferroelectric layers 121 and the metal layers 122 are stacked over the insulating layer 16. In some embodiments, the lowest metal layer may include a U-shape from a cross sectional perspective, and a bottom surface 1222 of the lowest metal layer 122 is in contact with the top surface 161 of the insulating layer 16.

In such embodiments, the plurality of ferroelectric layers 121 and the plurality of metal layers 122 are stacked toward an inner center of a U-shaped structure. Accordingly, not only the lowest metal layer 122, at least one of the ferroelectric layers 121 also includes a U-shape from a cross sectional perspective. In some embodiments, the two ends of each of the ferroelectric layers 121 and the metal layers 122 may be coplanar at the top stack surface 120. In some embodiments, the MFIS structure may include a core metal layer 124 at the upper center of the MFIS structure and laterally surrounded by a ferroelectric layer 121. The top surface of the core metal layer 124 is coplanar with the two ends of each of the ferroelectric layers 121 and the metal layers 122. In some embodiments, a planar ferroelectric layer 123 may be formed over the ferroelectric layers 121 and the metal layers 122. In some embodiments, the planar ferroelectric layer 123 is in contact with the top stack surface 120. The planar ferroelectric layer 123 is in contact with the metal gate structure 18 to prevent shorting.

Figure 4:
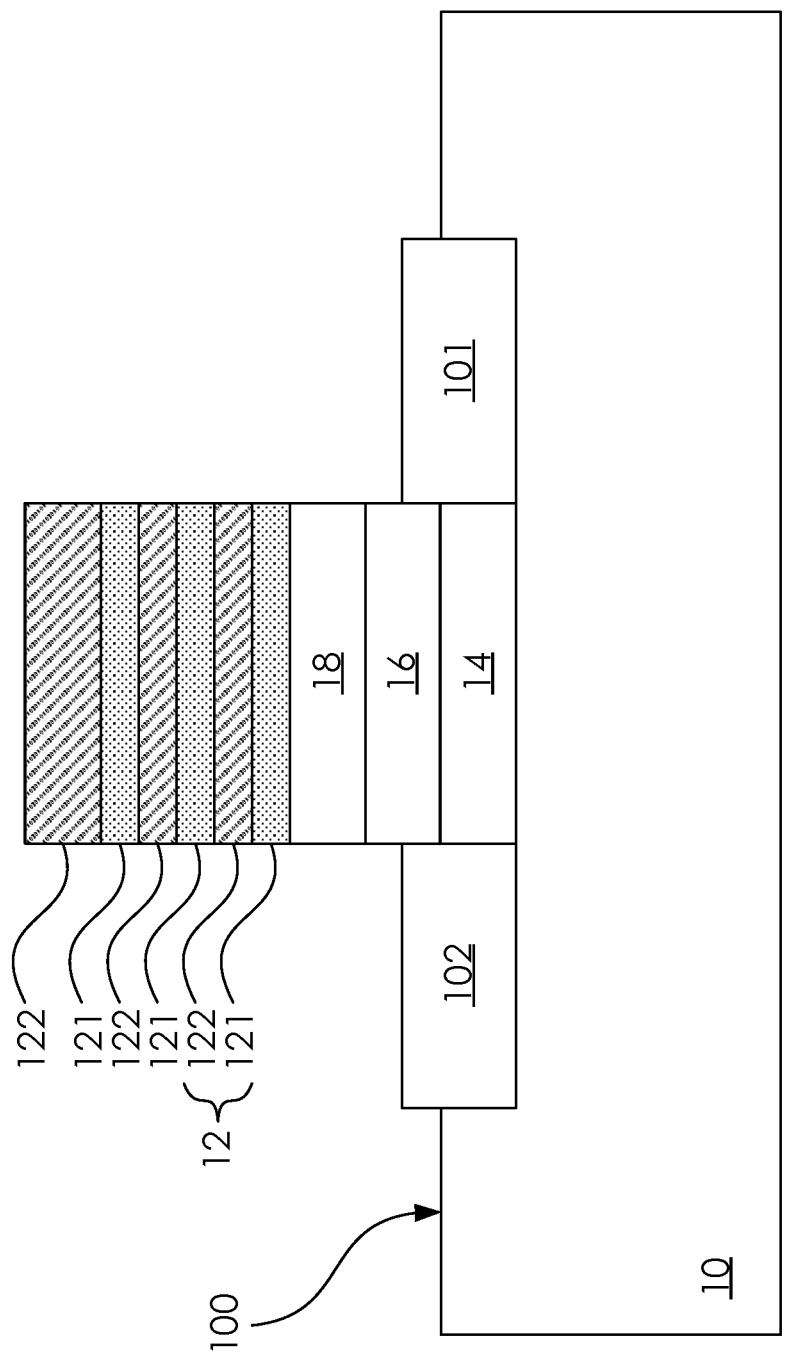
FIG. 4 illustrates a cross-sectional view of a semiconductor structure according to some embodiments of the present disclosure.

As shown in FIG. 4, in some embodiments, the semiconductor structure in the present disclosure may include a Metal Ferroelectric Metal (MFM) structure. It may be called as a Metal Insulator Metal (MIM) structure also since the ferroelectric material may be performed as an insulator in such embodiments. This structure can be defined as a MFMIS structure. The MFM/MIM structure may be used as a capacitor by each of the two adjacent metal layers as conductive capacitor plates in parallel with a ferroelectric layer with high dielectric constant sandwiched between.

In the embodiments regarding the MFM structure, each stack units 12 includes the ferroelectric layer 121 and the metal layer 122, and the stack units 12 are also formed over the insulating layer 16. Nevertheless, the metal gate structure 18 is formed between the insulator 16 and the stack units 12 instead of formed over the stack units 12. In such embodiments, each of the plurality of ferroelectric layers 121 separates the adjacent two metal layers 122, wherein the bottom metal layer is the metal gate structure 18.

Referring to FIG. 4, in some embodiments, the insulating layer 16 is adjacent to the first surface 100 of the substrate 10, and the insulating layer 16 is in contact with the metal gate structure 18. In such embodiments, the ferroelectric layers 121 and the metal layers 122 are stacked over the metal gate structure 18 so that the stack units 12 may be embedded in the semiconductor during the middle end of line (MEOL) process or the back end of line (BEOL) process. In such embodiments, the insulator in a conventional MFM/MIM structure is replaced by a plurality of thin ferroelectric layers and a plurality of thin metal layers, and the thickness of the conventional insulator (e.g., about 10 nm) is divided equally by those ferroelectric layers and metal layers. In other words, compared with the conventional MFM/MIM structure, the total thickness of the MFM/MIM structure in the present disclosure is basically not changed, even though the conventional insulator is replaced by a multilayer structure. In some embodiments, the top metal layer in the stack units 12 is performed as one of the metal layers of the MFM/MIM structure, and the thickness of the top metal layer is greater than the metal layers 122 there below.

Figure 5:
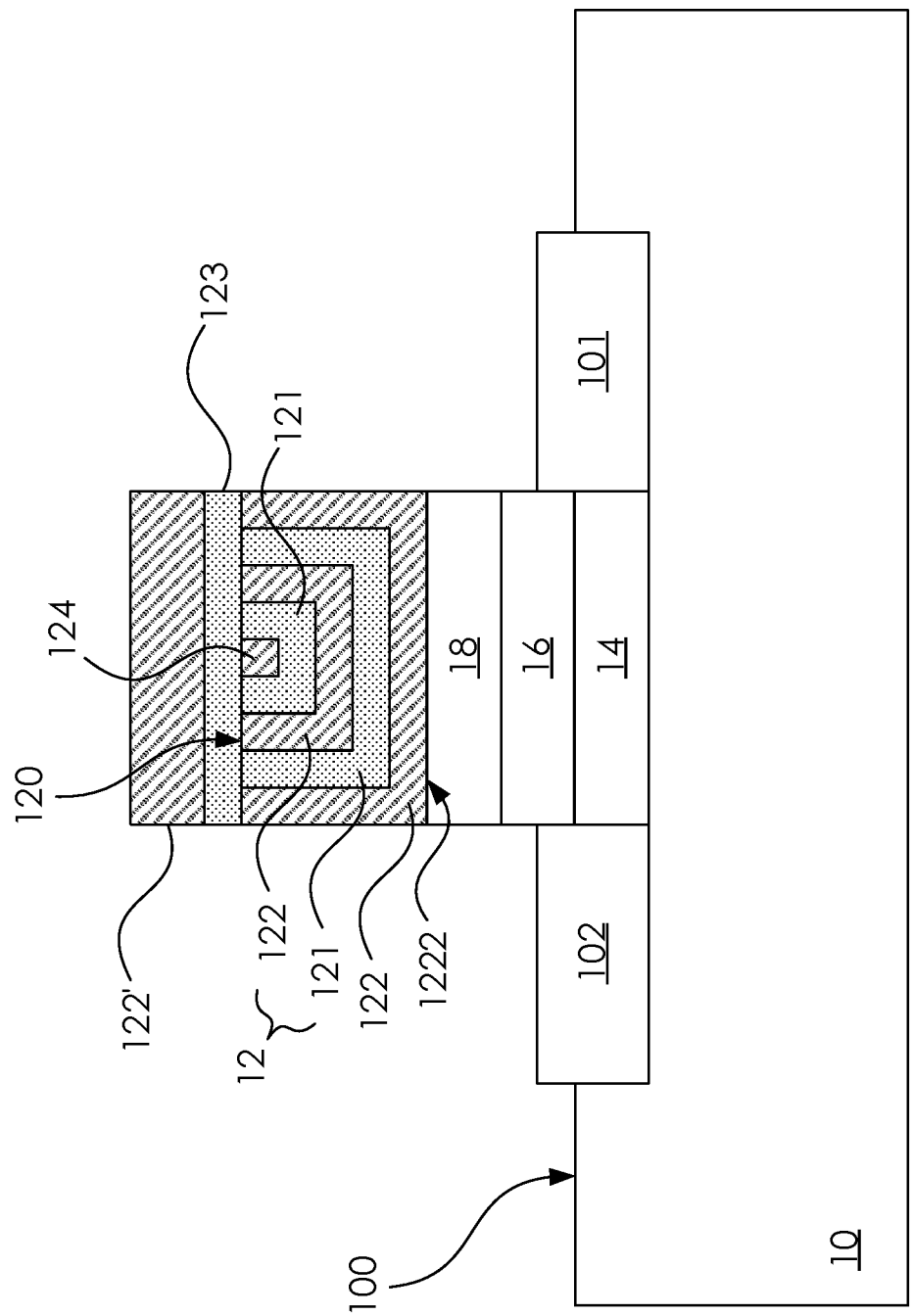
FIG. 5 illustrates a cross-sectional view of a semiconductor structure according to some embodiments of the present disclosure.

Referring to FIG. 5, the semiconductor structure in the present disclosure may include a Metal Ferroelectric Metal Insulator Semiconductor (MFMIS) structure, wherein the stack units 12 over the metal gate structure 18 are also included in the U-shaped structure. In such embodiments, the plurality of stack units 12 including the ferroelectric layers 121 and the metal layers 122 are stacked over the metal gate structure 18, wherein both of the ferroelectric layers 121 and the metal layers 122 include U-shapes. Moreover, the core metal layer 124 may be formed and laterally surrounded by the ferroelectric layer 121, wherein the core metal layer 124 and the two ends of each of the ferroelectric layers 121 and the metal layers 122 may be coplanar at a top stack surface 120. In some embodiments, the planar ferroelectric layer 123 may be formed over the top stack surface 120. In some embodiments, a metal layer 122' may be formed over the planar ferroelectric layer 123. The metal layer 122' is performed as the top metal layer of the MFMIS structure. In some embodiments, the planar ferroelectric layer 123 is in contact with the metal layer 122' to prevent shorting.

Figure 6:
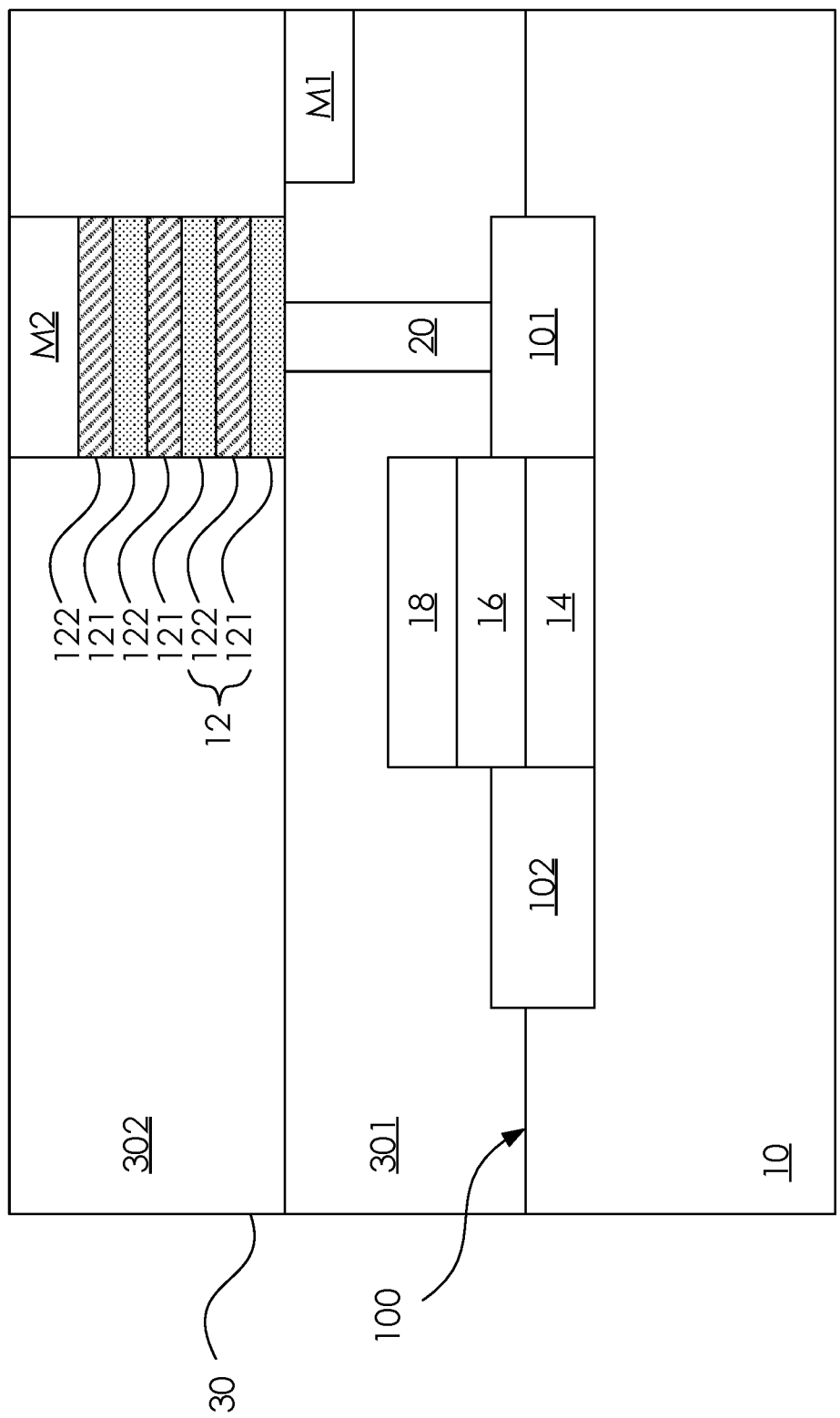
FIG. 6 illustrates a cross-sectional view of a semiconductor structure according to some embodiments of the present disclosure.

The semiconductor structure in the present disclosure may include a dynamic random access memory (DRAM) like structure. Referring to FIG. 6, in such embodiments, the DRAM-like structure includes a plurality of ferroelectric layers 121 and performed as a ferroelectric dynamin random access memory (FeRAM) structure. In such embodiments, one of the ferroelectric layers 121 is electrically coupled to the first doped region 101 through a conductive contact 20, in some embodiments, the first doped region 101 can be a drain region. In such embodiments, the stack units 12 are formed in the dielectric layer 30 during the back end of line (BEOL) process. In some embodiments, the FeRAM structure is vertically formed between a first metal line M1 and a second metal line M2 of the semiconductor structure. In some embodiments, the top surface of the FeRAM structure is in contact with the second metal line M2.

Figure 7:
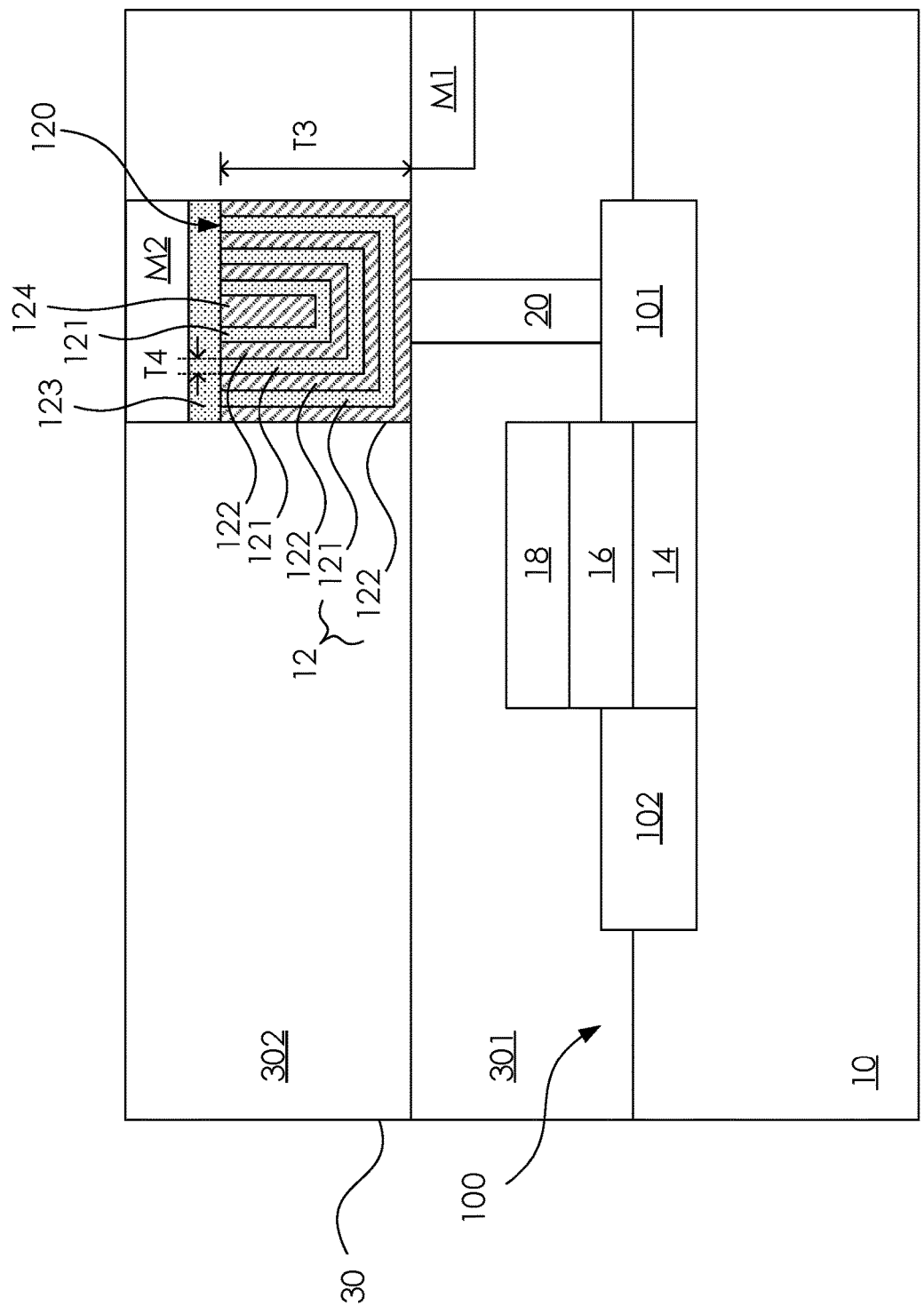
FIG. 7 illustrates a cross-sectional view of a semiconductor structure according to some embodiments of the present disclosure.

In some embodiments, the FeRAM structure may include a U-shaped stack including the plurality of ferroelectric layers and the plurality of metal layers. As shown in FIG. 7, the lowest metal layer 122 is U-shaped and electrically coupled to the first doped region 101 through the conductive contact 20. In some embodiments, the ferroelectric layers 121 and the metal layer 122 are stacked periodically toward an inner center of the FeRAM structure. In some embodiments, the FeRAM structure includes a core metal layer 124 at the upper center of the FeRAM structure and laterally surrounded by the ferroelectric layer 121. In some embodiments, the top surface of the core metal layer 124 and the two ends of each of the ferroelectric layers 121 and the metal layers 122 may be coplanar at a top stack surface 120. In some embodiments, the planar ferroelectric layer 123 may be formed over the top stack surface 120. As previous mentioned in FIG. 6, the FeRAM structure may be formed between the first metal line M1 and the second metal line M2 of the semiconductor structure, therefore in some embodiments, the planar ferroelectric layer 123 is in contact with the second metal line M2 to prevent shorting.

In some embodiments, the thickness T3 of the FeRAM structure with the U-shape stack can be over about 10 nm, such thickness is larger than the thickness of the MFIS structure, MFM/MIM structure, and the FeRAM structure without the U-shape stack as previous mentioned. By using the U-shape stack, the thickness T3 of the FeRAM structure has no strong correlation to the substantial thickness of each of the ferroelectric layer 121, instead, the thickness T4 of each of the U-shaped ferroelectric layers 121 may dictate the grain size.

Figure 8A:
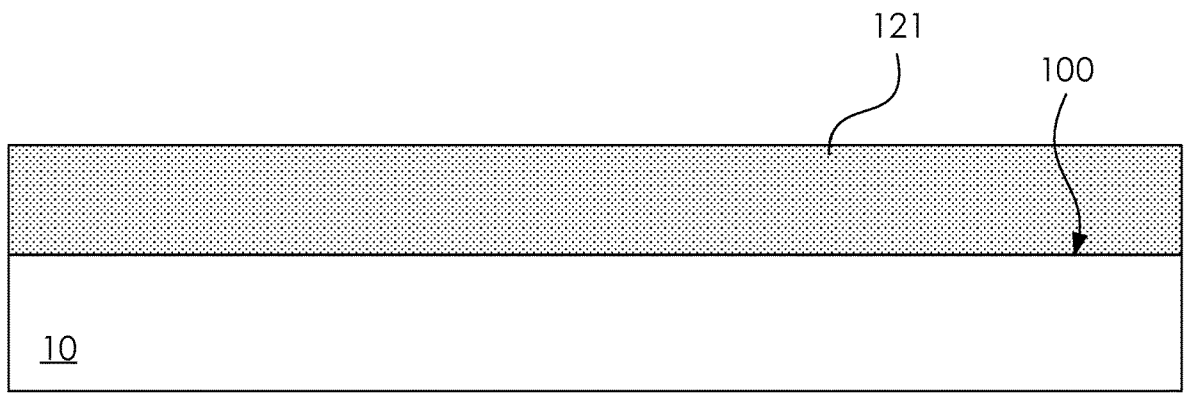
FIGS. 8A to 8I illustrate cross-sectional views at various operations of manufacturing a semiconductor structure according to some embodiments of the present disclosure.

In some embodiments that forming the MFIS structure as previously shown in FIG. 1, referring to FIG. 8A, one of the plurality of the ferroelectric layers 121 may be formed on the first surface 100 of the substrate 10. The ferroelectric layer 121 may be formed by spin-on deposition, physical vapor deposition (PVD), chemical vapor deposition (CVD), atomic layer deposition (ALD), metal organic deposition (MOD), plasma enhanced chemical vapor deposition (PECVD), or the like. In some embodiments, the thickness of the bottom ferroelectric layer 121 may have a thickness greater than other ferroelectric layers 121 during the deposition operation because a portion of such ferroelectric layers 121 may be performed as an insulating layer 16 afterward due to the diffusion of oxygen.

Figure 8B:
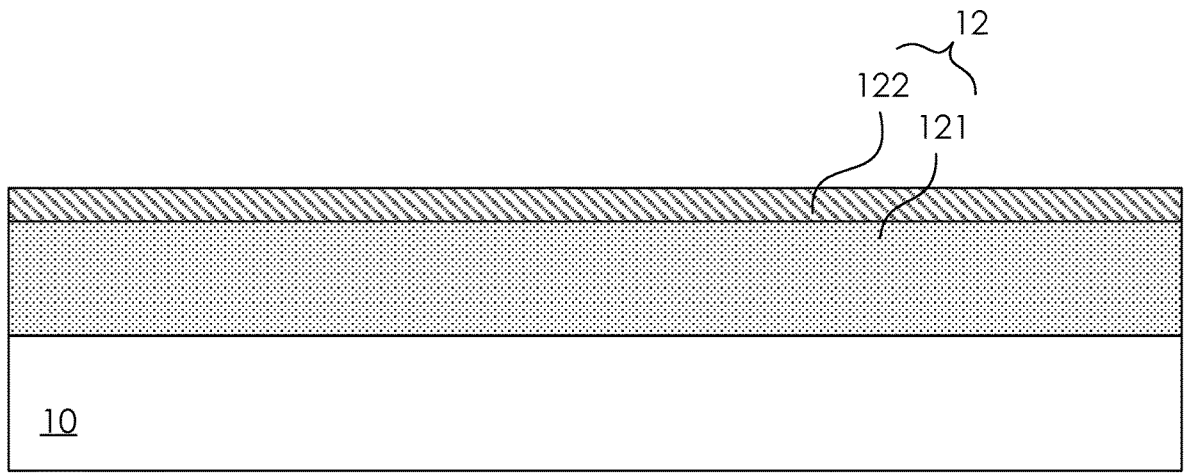

Referring to FIG. 8B, after the first one of the ferroelectric layers 121 is formed, one of the plurality of metal layers 122 may be formed on the ferroelectric layer 121. The metal layer 122 may be formed by spin-on deposition, PVD, CVD, ALD, MOD, PECVD, or the like. In some embodiments, the thickness of the metal layer 122 may be less than about 5 nm.

Figure 8C:
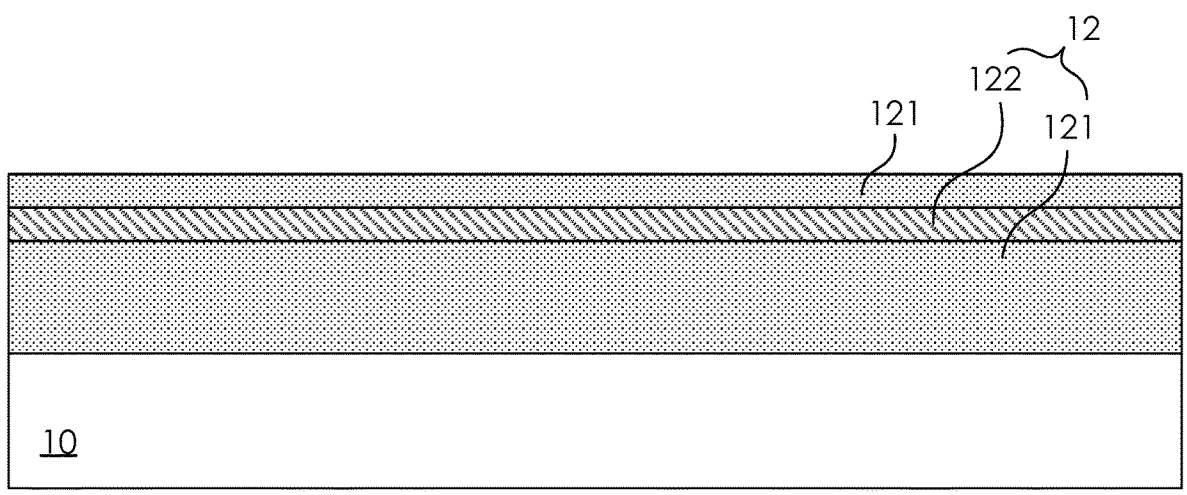
Figure 8D:
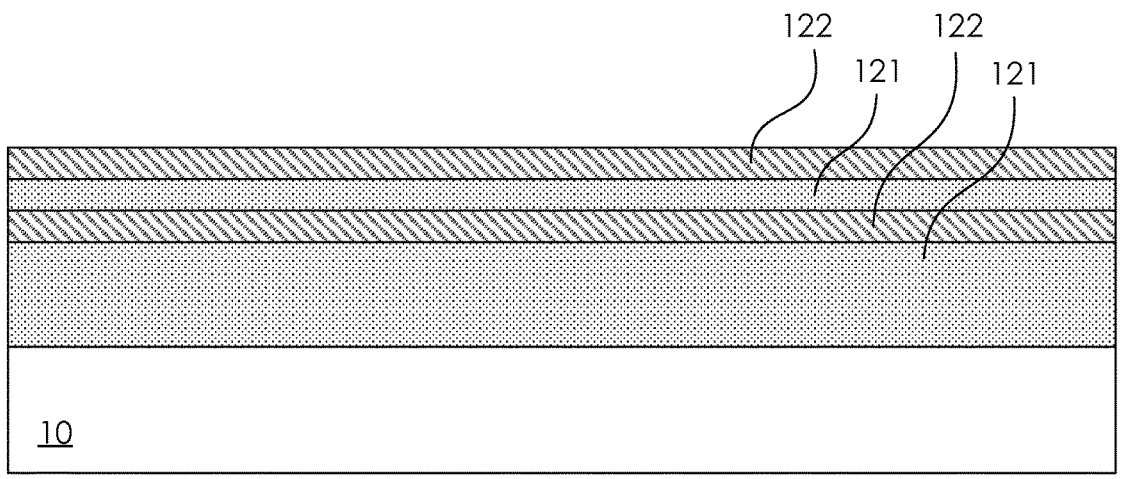
Figure 8E:
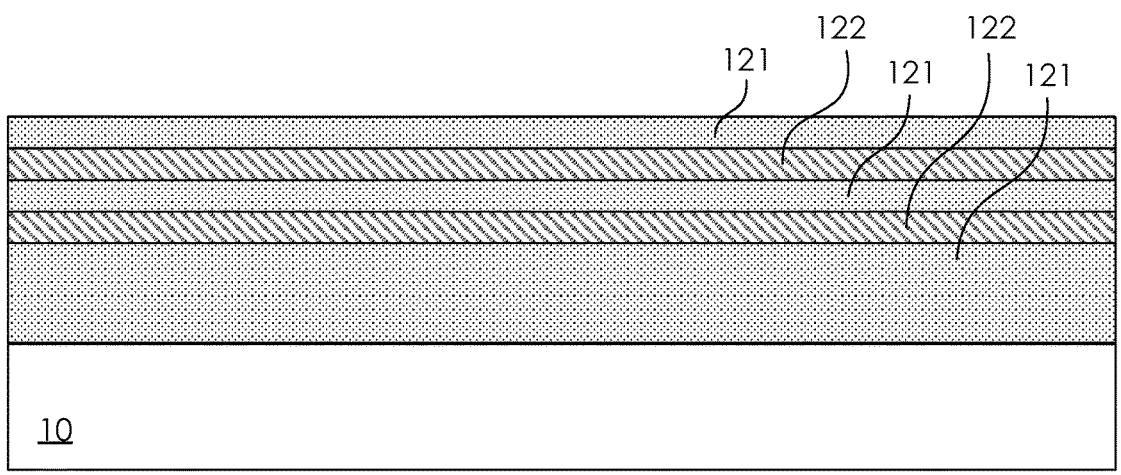

Referring to FIGS. 8C to 8E, the plurality of ferroelectric layers 121 and the plurality of metal layers 122 may be formed alternately on the structure shown in FIG. 8B. Each two adjacent ferroelectric layer and metal layer may be defined as a stack unit 12, and such stack units 12 are stacked over first surface 100 of the substrate 10 repeatedly. Because the total thickness of the stack units 12 is about 10 nm, in some embodiments, for instance, the MFIS structure may include two stack units 12 and the thicknesses of each of the ferroelectric layer 121 and metal layer 122 may be about 2.5 nm, respectively.

Figure 8F:
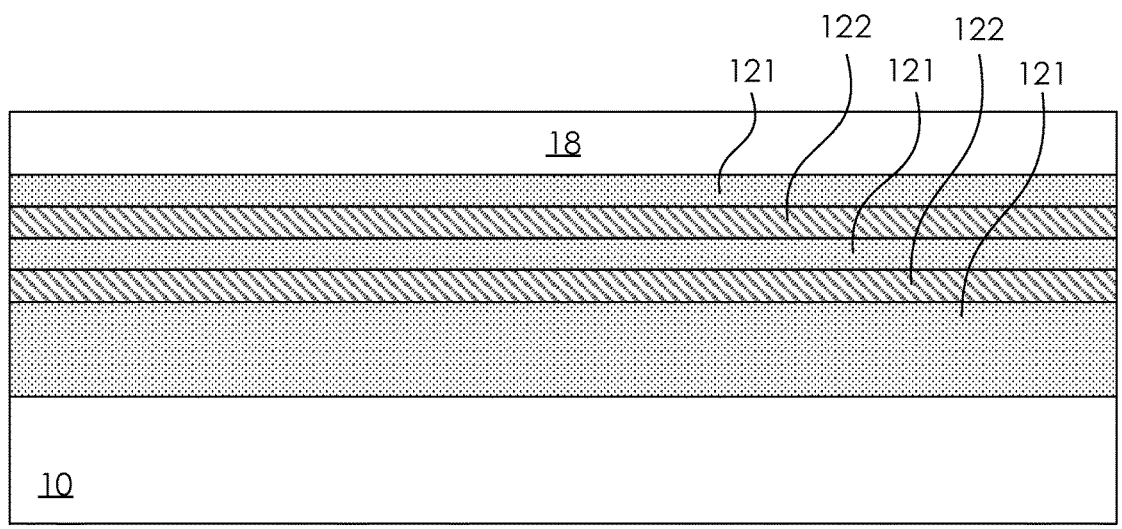

Referring to FIG. 8F, a metal material may be disposed on the top surface of the stacks for forming the metal gate structure 18. The material of the metal gate structure 18 may be formed by PVD, CVD, ALD, MOD, PECVD, or the like.

Figure 8G:
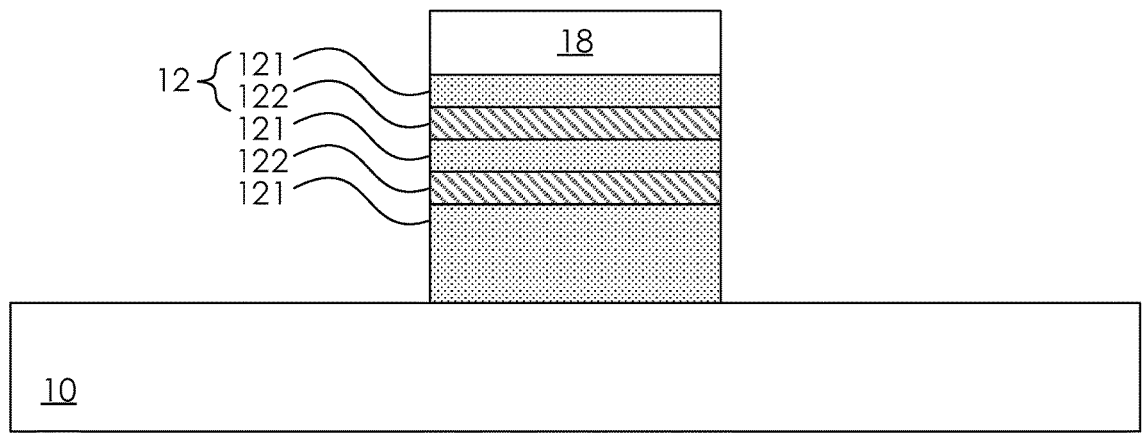

Referring to FIG. 8G, after the metal material of the metal gate structure 18 is formed, such metal material and the stack units below may be patterned to form the main portion of the MFIS structure as previously shown in FIG. 1 by etching. The MFIS structure is formed during the front end of line (FEOL) process, therefore, in some embodiments, the MFIS structure may be further laterally surrounded by an interlayer dielectric layer by follow-up operations.

Figure 8H:
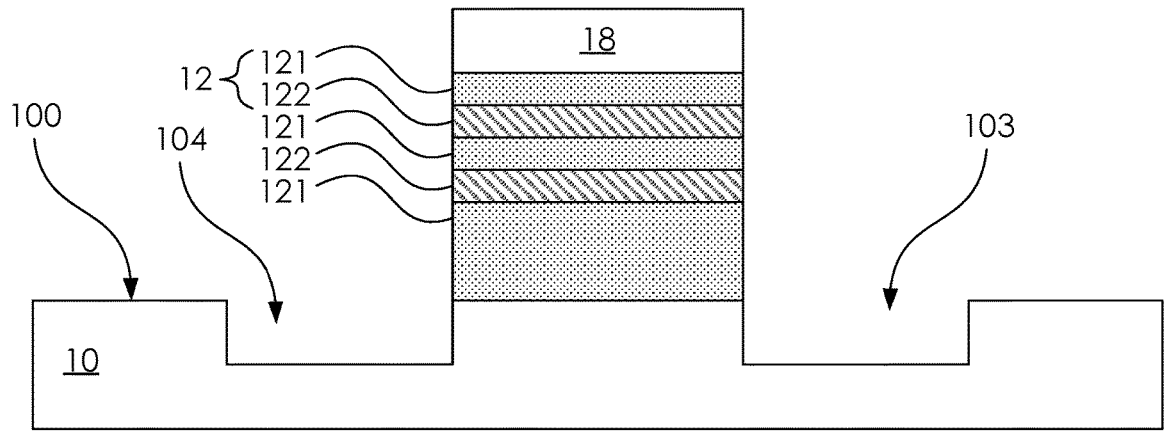
Figure 8I:
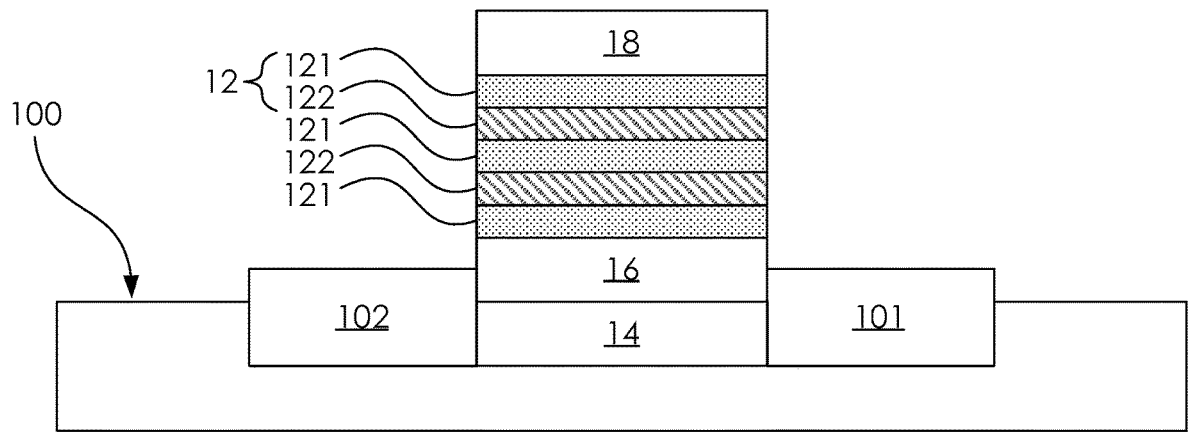

Referring to FIGS. 8H and 8I, after the main portion of MFIS structure is formed, in some embodiments, a third trench 103 and a forth trench 104 may be formed at the first surface 100 of the substrate 10 and adjacent to the main portion of MFIS structure. The source and drain structure may be formed from the third trench 103 and the forth trench 104 by silicon epitaxial deposition. Accordingly, the substrate 10 may thus include the first doped region 101 and the second doped region 102 as aforementioned. In some embodiments, the insulating layer 16 is composed of native oxide layer originally on the first surface 100 of the substrate 10 and a portion of the ferroelectric layer 121 to which the oxygen atoms diffuse from the native oxide layer.

In the operations of forming the semiconductor structure including the MFM/MIM structure as previously shown in FIG. 4, the metal material for forming the metal gate structure 18 may be disposed over the first surface 100 of the substrate 10 prior to forming the plurality of stack units 12. Because forming each of the stack units 12 includes forming the ferroelectric layer 121 and forming the metal layer 122 on the ferroelectric layer 121, these operations are similar with the operations of forming the ferroelectric layers 121 and the plurality of metal layers 122 alternately as shown in FIGS. 8B to 8E.

In some embodiments, the metal layer in the top stack unit 12 in the MFM/MIM structure is the metal layers of the MFM/MIM structure, and has a thickness greater than the metal layers 122 therebelow. In some embodiments, the MFM/MIM structure may be formed during the back end of line (BEOL) process instead of the middle end of line (MEOL) process as abovementioned.

Figure 9A:
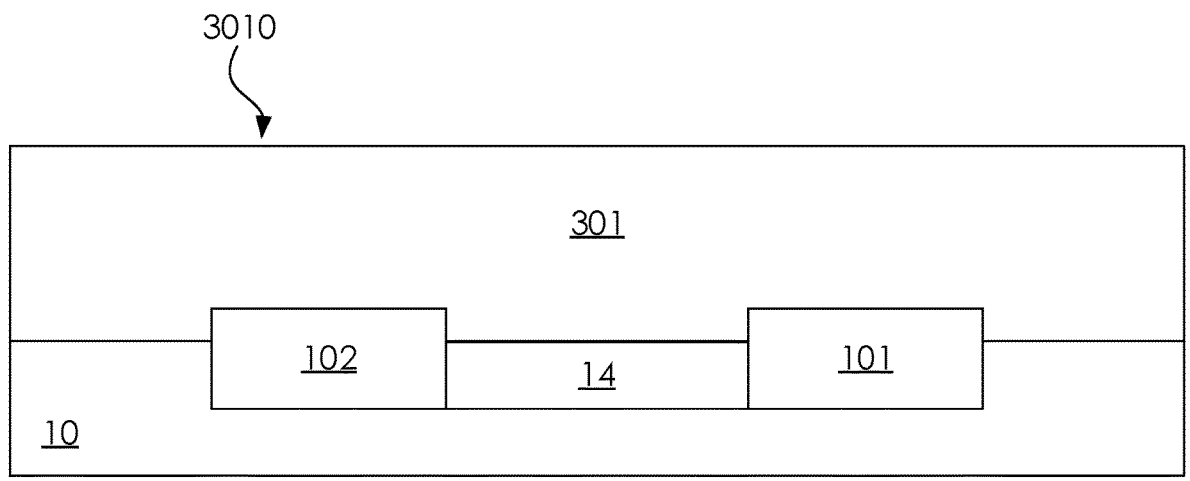
FIGS. 9A to 9J illustrate cross-sectional views at various operations of manufacturing a semiconductor structure according to some embodiments of the present disclosure.
Figure 9B:
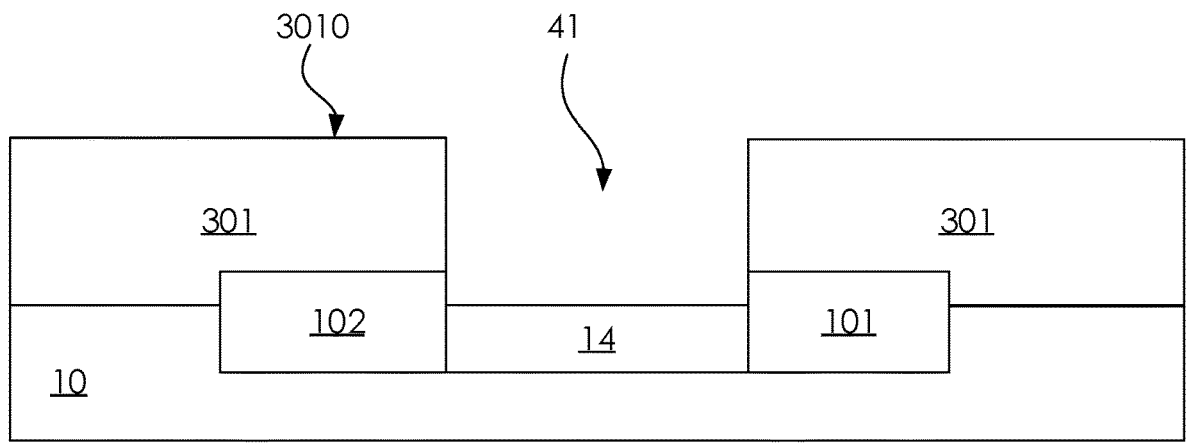
Figure 9C:
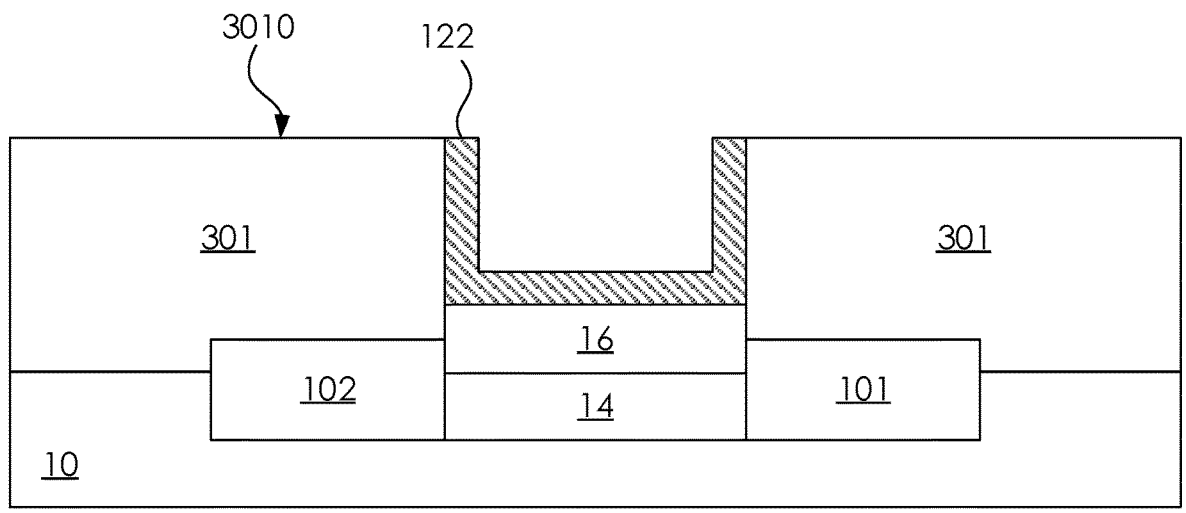
Figure 9D:
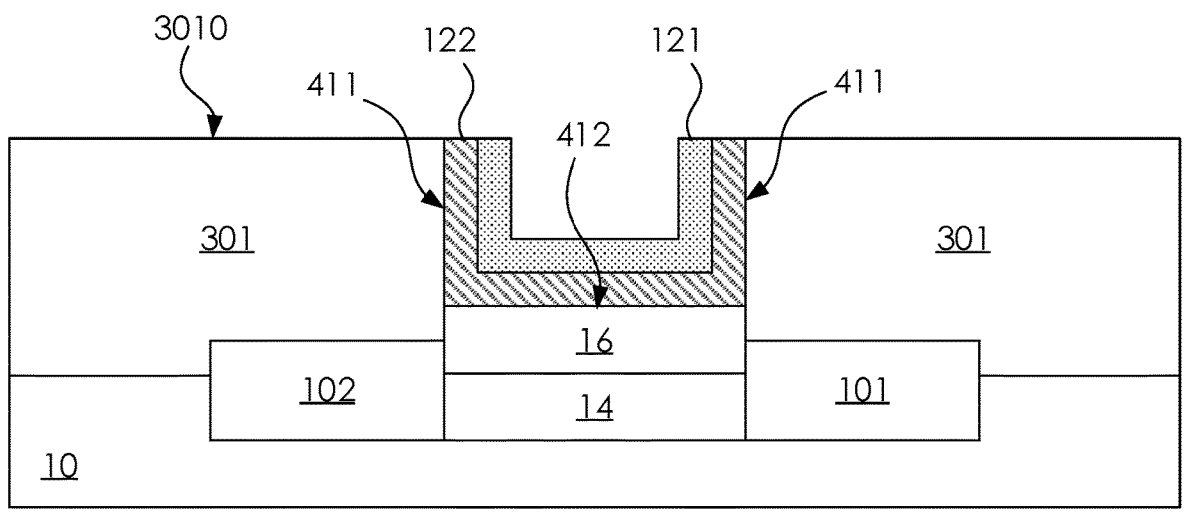
Figure 9E:
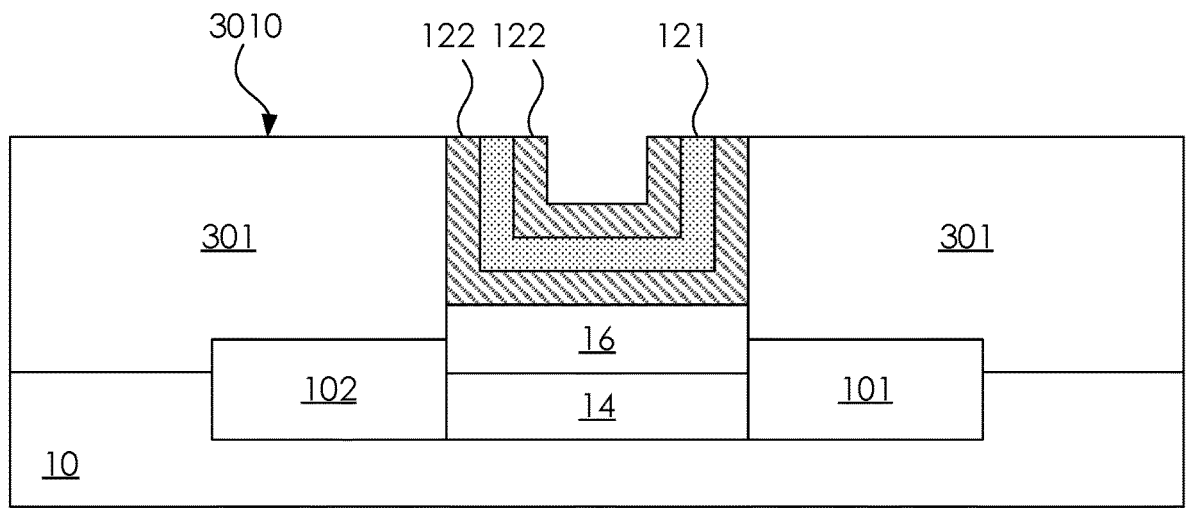
Figure 9F:
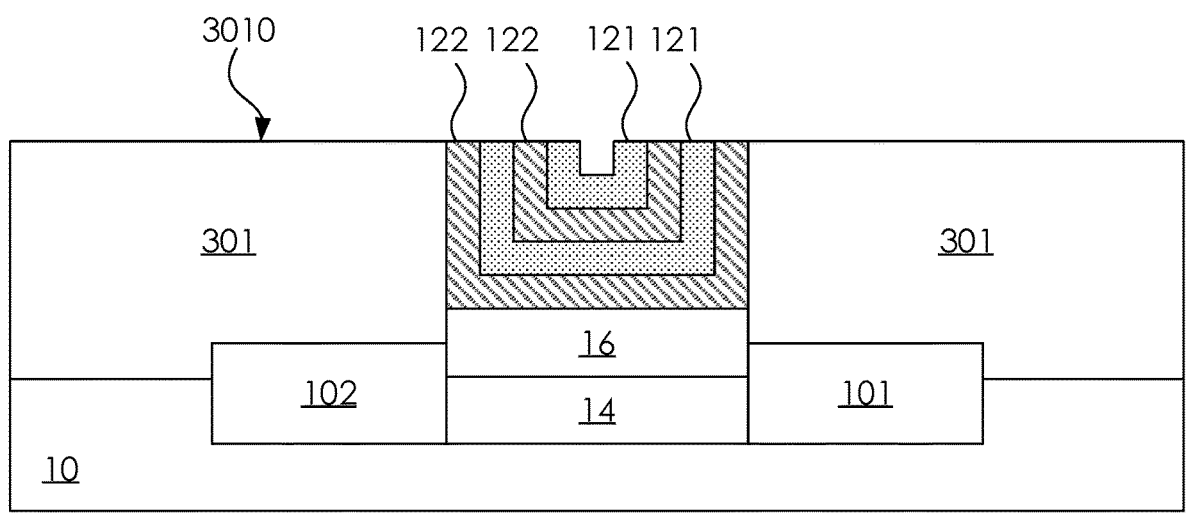
Figure 9G:
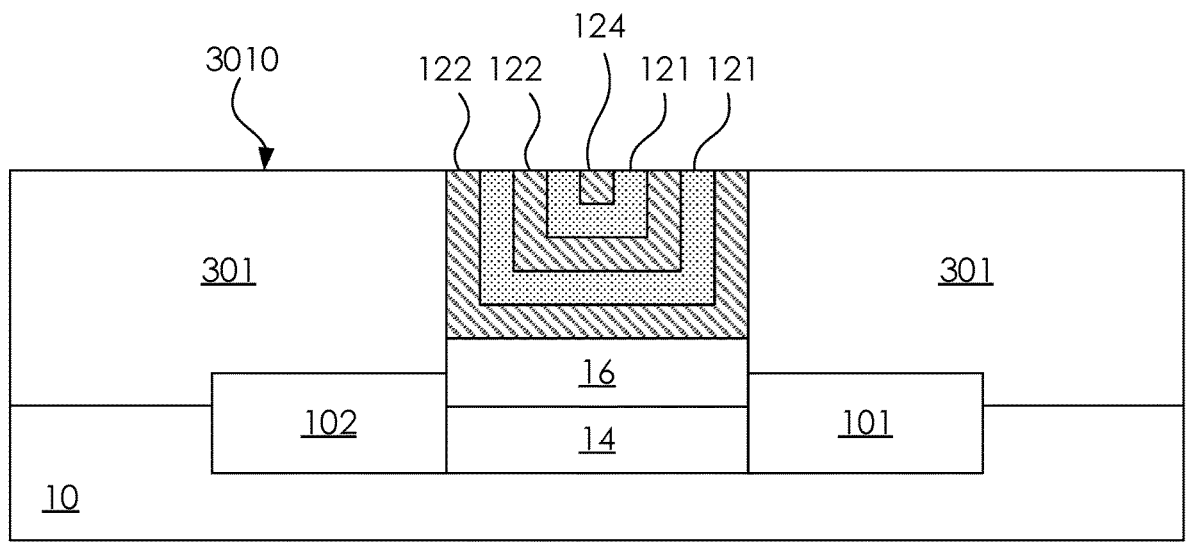

In the operations of forming the semiconductor structure including the MFIS structure as previously shown in FIG. 3, in some embodiments, as shown in FIG. 9A, a first dielectric layer 301 may be formed over the first surface 100 of the substrate 10 and covers the conducting channel 14. Next, as shown in FIG. 9B, a first trench 41 may be formed at the top surface 3010 of the first dielectric layer 301 prior to forming the plurality of stack units. The top surface of the conducting channel 14 may be exposed by the first trench 41. In some embodiments, the thickness of the first trench is about 10 nm or may be larger than about 10 nm.

Then, the plurality of ferroelectric layers 121 and the plurality of metal layers 122 in the MFIS structure may be formed in the first trench 41 by a via fill process. Referring to FIGS. 9C to 9G, the metal layers 122 and the ferroelectric layers 121 may be formed by depositing operations alternately in the first trench 41 and over the top surface 3010 (not shown in the figures). In some embodiments, each of the stack units 12 includes covering a side surface 411 and a bottom surface 412 of the first trench 41 by the metal layer 122. In some embodiments, the insulating layer 16 may be formed on the conducting channel 14 by the diffusion of oxygen.

In some embodiments, the last metal layer formed in such operations is the core metal layer 124, which is at the upper center of the MFIS structure and laterally surrounded by the ferroelectric layer 121. Subsequently, the portion that formed over the top surface 3010 may be removed by a chemical mechanical polishing (CMP) operation and/or an etching operation to expose the top surface 3010 and the top stack surface 120.

Figure 9H:
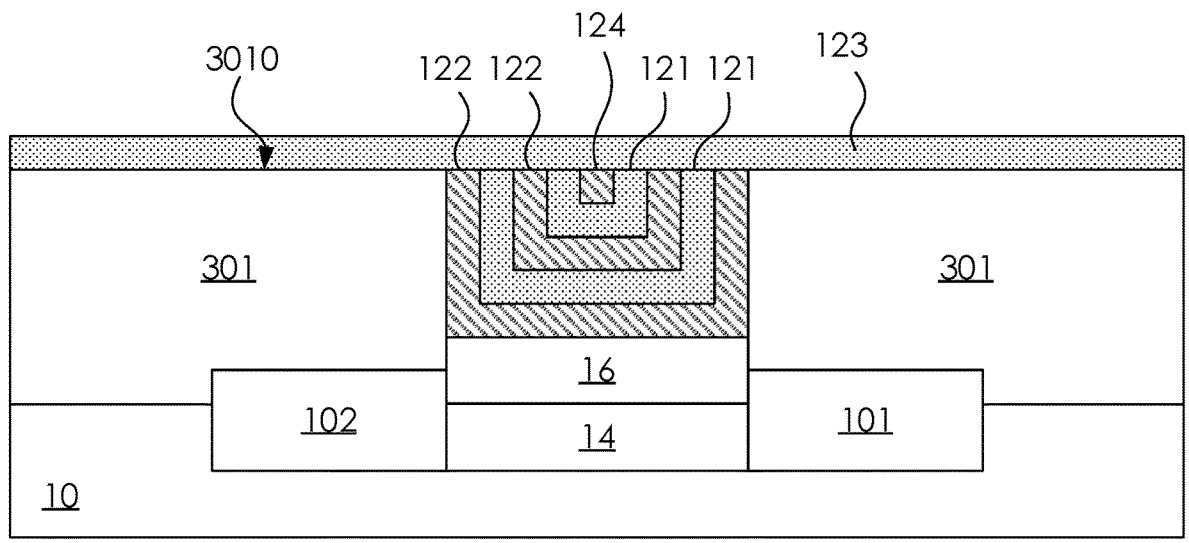
Figure 9I:
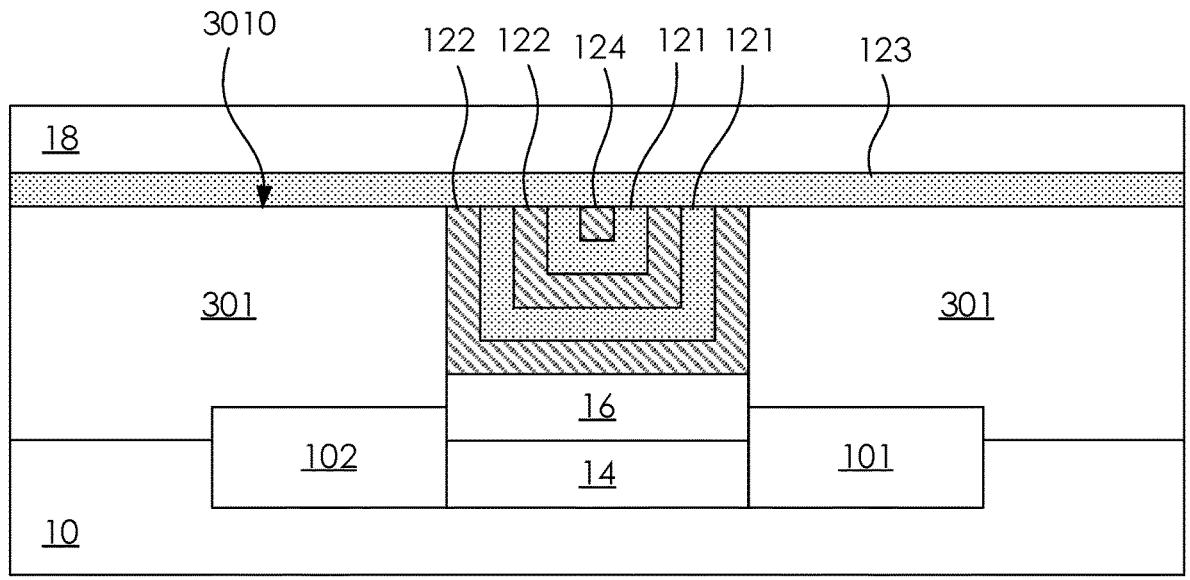
Figure 9J:
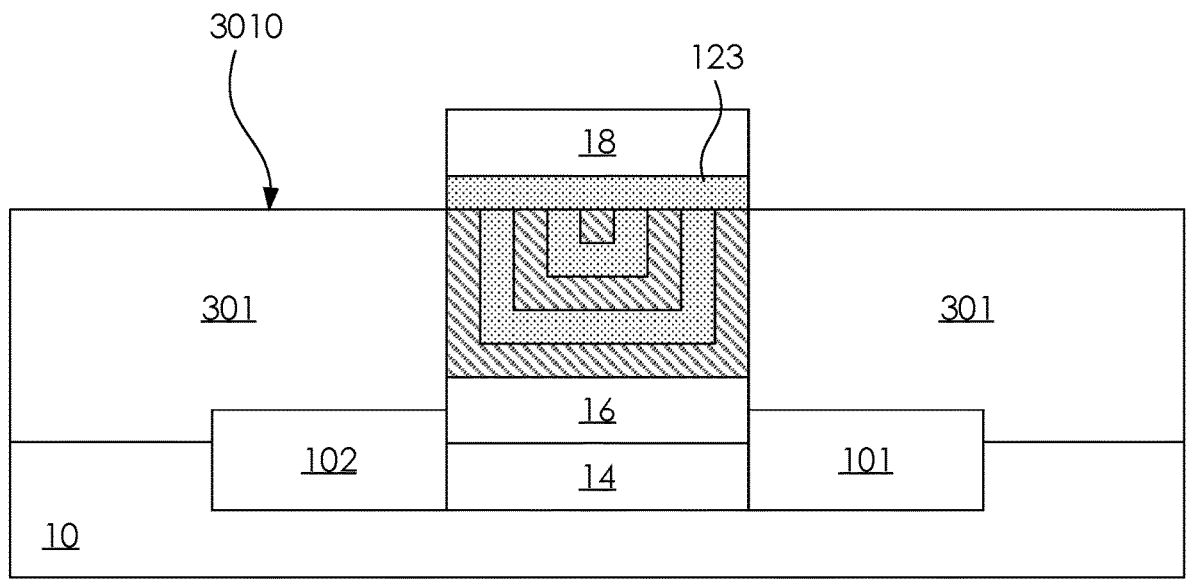

In addition, referring to FIGS. 9H to 9J, the planar ferroelectric layer 123 may be formed over the top stack surface 120, and the metal gate structure 18 may be formed directly on the planar ferroelectric layer 123 by depositing operations and be patterned to form the MFIS structure as previously shown in FIG. 3 by etching.

In the operations of forming the semiconductor structure including the MFMIS structure as previously shown in FIG. 5 with U-shaped stack units, the metal material for forming the metal gate structure 18 may be disposed on the insulating layer 16 prior to forming the plurality of U-shaped stack units. The U-shaped stack units may refer to the operations as shown in FIGS. 9C to 9G and the detailed operations are omitted here for brevity.

Figure 10A:
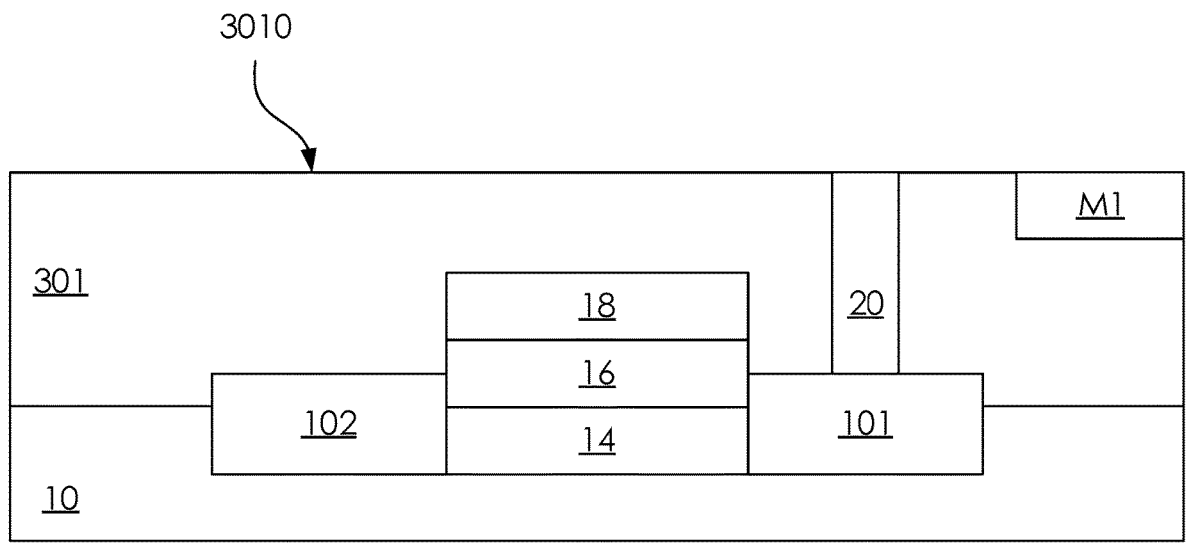
FIGS. 10A and 10B illustrate cross-sectional views at various operations of manufacturing a semiconductor structure according to some embodiments of the present disclosure.

In the operations of forming the semiconductor structure including the FeRAM structure as previously shown in FIG. 6 with planar stack units and as previously shown in FIG. 7 with U-shaped stack units, referring to FIG. 10A, these stack units may be formed over the top surface 3010 of the first dielectric layer 301 and at least electrically connected to the conductive contact 20.

The FeRAM structure with planar stack units may be formed by the operations disclosed in previously shown FIGS. 8B to 8F. The detailed operations are omitted here for brevity.

Figure 10B:
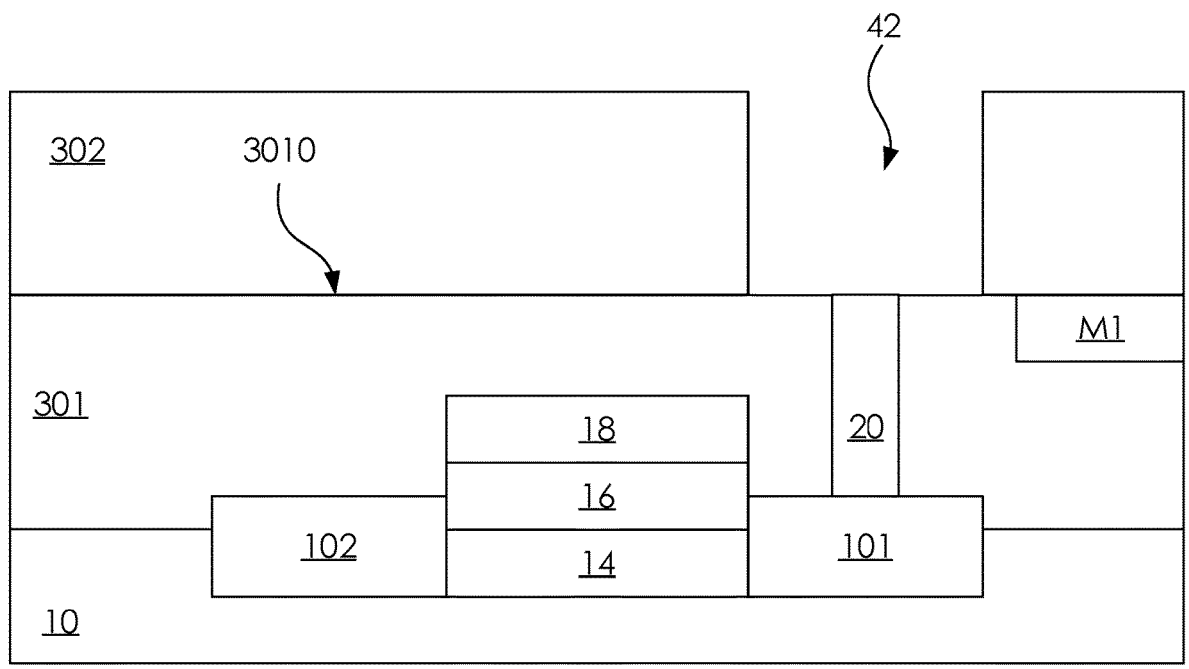

Referring to FIG. 10B, in some embodiments, a second dielectric layer 302 may be formed over the first dielectric layer 301, and a second trench 42 may be formed in the second dielectric layer 302 prior to forming the plurality of stack units 12. In such embodiments, the conductive contact 20 is exposed when forming the second trench 42 in the second dielectric layer 302. Next, the U-shaped stack units may be formed in the second trench 42 by using the similar operations as disclosed in previously shown FIGS. 9C to 9G. The detailed operations are omitted here for brevity. In some embodiments, after forming the U-shaped stack units in the second trench 42, the second metal line M2 may be formed on the top surface of the U-shaped stack units.

According to the present disclosure, the semiconductor structure includes a plurality of stack units in the MFIS, MFMIS, MFM/MIM, or FeRAM structure to replace a unitary ferroelectric layer. The thin ferroelectric layers in each of the stack units may be planar or U-shaped in different embodiments, and the thickness of each of the thin ferroelectric layers may be reduced to about 5 nm or less. Accordingly, grain size of the ferroelectric materials may be restricted to such thicknesses and therefore the electrical performance of such semiconductor structures may be substantially uniformized.

In one exemplary aspect, a semiconductor structure is provided. The semiconductor structure includes a substrate, a plurality of ferroelectric layers, and a plurality of metal layers. The substrate has a first surface. The plurality of ferroelectric layers stack over the first surface. The plurality of metal layers stack over the first surface of the substrate, and each of the metal layers is on each of the ferroelectric layers.

In another exemplary aspect, a semiconductor structure is provided. The semiconductor structure includes a substrate, a plurality of metal layers, and a plurality of ferroelectric layers stacked over the first surface, and each of the plurality of ferroelectric layers separated by two or more adjacent metal layers.

In yet another exemplary aspect, a method for manufacturing a semiconductor structure is provided. The method includes the following operations. A substrate having a first surface is provided. A plurality of stack units are formed over the first surface of the substrate. The formation of each of the stack units includes the following operations. A ferroelectric layer is formed. A metal layer is formed on the ferroelectric layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate having a first surface;
a plurality of ferroelectric layers stacking over the first surface;
a plurality of metal layers stacking over the first surface of the substrate, and each of the metal layers is on each of the ferroelectric layers; and
a planar ferroelectric layer over the ferroelectric layers and the metal layers, wherein the planar ferroelectric layer is in direct contact with a first ferroelectric layer of the plurality of ferroelectric layers.

2. The semiconductor structure of claim 1, wherein a thickness of the ferroelectric layer is less than 5 nm.

3. The semiconductor structure of claim 1, further comprising:
an insulating layer adjacent to the first surface of the substrate, wherein the insulating layer is in contact with a metal gate structure.

4. The semiconductor structure of claim 1, wherein one of the ferroelectric layers comprises a U-shape from a cross sectional perspective.

5. The semiconductor structure of claim 1, further comprising:
a conductive structure over the planar ferroelectric layer, wherein the conductive structure comprises metal.

6. The semiconductor structure of claim 1, further comprising:
a first doped region of a first conductivity type in the substrate and adjacent to a side of an insulating layer.

7. The semiconductor structure of claim 1, wherein one of the metal layers comprises a U-shape from a cross sectional perspective.

8. The semiconductor structure of claim 1, wherein the planar ferroelectric layer is in direct contact with a first metal layer of the plurality of the metal layers.

9. A semiconductor structure, comprising:
a substrate having a first surface;
a plurality of metal layers stacking over the first surface of the substrate;
a plurality of ferroelectric layers stacking over the first surface, and each of the plurality of ferroelectric layers separates adjacent two metal layers, wherein two ends of each of the metal layers and two ends of each of the ferroelectric layers are in contact with a planar ferroelectric layer.

10. The semiconductor structure of claim 9, further comprising a metal gate structure under the metal layers and the ferroelectric layers.

11. The semiconductor structure of claim 9, further comprising:
a core metal layer laterally surrounded by the ferroelectric layer.

12. The semiconductor structure of claim 9, wherein a thickness of each of the ferroelectric layers is identical to a vertical dimension of a grain in each of the ferroelectric layers.

13. The semiconductor structure of claim 9, wherein the planar ferroelectric layer is entirely covered by a top metal layer.

14. The semiconductor structure of claim 9, wherein a thickness of each of the metal layers is less than 5 nm.

15. A method for manufacturing a semiconductor structure, comprising:
- providing a substrate having a first surface;
- forming a plurality of stack units over the first surface of the substrate, forming each of the stack units comprising:
  - forming a first ferroelectric layer; and
  - forming a metal layer on the first ferroelectric layer; and
- forming a second ferroelectric layer extending over a top surface of one of the stack unit wherein the second ferroelectric layer is in direct contact with the first ferroelectric layer and the metal layer.

16. The method of claim 15, further comprising:
- forming an insulating layer adjacent to the first surface; and
- forming a metal gate structure on the insulating layer prior to forming the plurality of stack units.

17. The method of claim 15, further comprising:
- forming a dielectric layer over the first surface of the substrate; and
- forming a trench in the dielectric layer prior to forming the plurality of stack units.

18. The method of claim 17, wherein forming each of the stack units comprises covering a side surface and a bottom surface of the trench by the metal layer.

19. The method of claim 17, wherein a depth of the trench is 10 nm.

20. The method of claim 15, wherein a thickness of the first ferroelectric layer is identical to that of the metal layer.

* * * * *